US005998267A

United States Patent [19]

[11] Patent Number: 5,998,267

Bergemont et al.

[45] Date of Patent: Dec. 7, 1999

[54] PROCESS TO MANUFACTURE HIGH DENSITY ULSI ROM ARRAY

[75] Inventors: Albert Bergemont, Palo Alto; Alexander Kalnitsky, San Francisco, both of Calif.

[73] Assignee: National Semiconductor Corporation, Santa Clara, Calif.

[21] Appl. No.: 09/156,940

[22] Filed: Sep. 18, 1998

[51] Int. Cl.[6] ...................... H01L 21/336; H01L 21/8236

[52] U.S. Cl. .......................... 438/270; 438/271; 438/276; 438/278; 438/589

[58] Field of Search .................................... 438/270, 271, 438/272, 268, 278, 277, 276, 587, 589, FOR 208, FOR 209, FOR 210

[56] References Cited

U.S. PATENT DOCUMENTS

| | | | |
|---|---|---|---|
| 4,116,720 | 9/1978 | Vinson | 438/271 |
| 4,194,283 | 3/1980 | Hoffmann | 438/271 |
| 5,204,835 | 4/1993 | Eitan | 365/185 |
| 5,590,068 | 12/1996 | Bergemont | 365/63 |
| 5,595,927 | 1/1997 | Chen et al. | 438/270 |
| 5,763,925 | 6/1998 | Hsu | 257/390 |
| 5,877,537 | 3/1999 | Aoki | 257/330 |
| 5,882,972 | 3/1999 | Hong et al. | 438/276 |
| 5,904,526 | 5/1999 | Wen et al. | 438/278 |

OTHER PUBLICATIONS

Bergemont, et al., *High Density ROM Cell Structure for ULSI ROM Array*, Co–pending U.S. Application 09/156,941 filed Sep. 18, 1998.

*Primary Examiner*—Michael Trinh
*Attorney, Agent, or Firm*—Limbach & Limbach L.L.P.

[57] ABSTRACT

A compact MOS array including word lines perpendicular to and overlapping bit lines, is fabricated by etching trenches in the underlying silicon and then forming successive bit lines within the trenches and upon the intervening mesas. Subsequent implantation of dopant into trench sidewalls creates channel regions oriented at an angle relative to the horizontal bit lines. Disposing successive diffused bit lines in vertically separated planes enables fabrication of ROM cells having full channel lengths which occupy a smaller surface area. Tilted ion implantation may be utilized to introduce dopant into channel regions.

6 Claims, 18 Drawing Sheets

PROCESS TO MANUFACTURE HIGH DENSITY ULSI ROM ARRAY

BACKGROUND OF THE INVENTION

1. Field of the Invention

The present invention relates to an array of MOS semiconductor devices and a process for forming the array, and in particular, to a ROM array having successive bit lines disposed in vertically separated planes, thereby minimizing the horizontal surface area occupied by the array.

2. Description of the Related Art

FIG. 1 shows a plan view of an NMOS ROM array formed in a single horizontal plane, as disclosed in U.S. Pat. No. 5,590,068 ("the '068 Patent"). FIG. 1A shows a cross-sectional view along line 1A–1A'. FIG. 1B shows a cross-sectional view along line 1B–1B'.

The '068 patent teaches creation of an alternate virtual ground ROM array 100 of data storage cells 102. In FIG. 1, the array is shown as a plurality of NMOS ROM devices formed within lightly doped P-type silicon 114. ROM data storage cells 102 are defined by overlapping of a word line 104 over a pair of diffused bit lines 106. Diffused bit lines 106 actually consist of global diffused bit lines 106*a* alternating with local diffused bit lines 106*b*. Local diffused bit lines 106*b* are grounded and serve as the sources of cells 102 of array 100.

Polysilicon word lines 104 are oriented perpendicular to diffused bit lines 106 and are separated from bit lines 106 by a gate oxide layer 108. Where a polysilicon word line 104 crosses over channel region 110 between successive diffused bit lines 106*a* and 106*b*, MOS semiconductor device 102 is formed having local diffused bit lines 106*b* as the source, global diffused bit line 106*a* as the drain, word line 104 as the gate, and gate oxide layer 108 as the gate.

Array 100 is divided into segments. Within each segment, the size of each cell 100 can be estimated by the pitches of word lines 104 and diffused bit lines 106. For design rules based upon a pitch of $\lambda$, the cell size is $4\lambda^2$. This calculation is based on an array structure in which all diffused bit lines and cell transistors are disposed in the same horizontal plane.

The ROM array structure disclosed by the '068 Patent is adequate to perform its intended function. However, this ROM structure consumes substantial amounts of surface area of the underlying silicon.

Therefore, there is a need in the art for a ROM array structure and a process for forming such an array structure that is more compact and occupies less silicon surface area.

SUMMARY OF THE INVENTION

The present invention relates to a compact MOS array structure fabricated by etching trenches in the underlying semiconducting material, and then forming diffused bit lines with in the trenches and upon the intervening mesas. Selective implantation of dopant into trench sidewalls creates channel regions which determine the functionality of the array. Disposing diffused bit lines on different horizontal planes (within the trenches and upon the intervening mesa tops) enables fabrication of an array of MOS devices which is smaller without reducing channel length.

The features and advantages of the present invention will be understood upon consideration of the following detailed description of the invention and the accompanying figures.

DETAILED DESCRIPTION

The present invention is based upon disposing diffused bit lines of an NMOS array in vertically separated planes, such that the channels of the MOS transistors are located in the trench sidewalls disposed at an angle to the bit lines. Implementation of the ROM array structure in accordance with the present invention results in substantial conservation in the silicon surface area consumed by the array.

Figure 2:
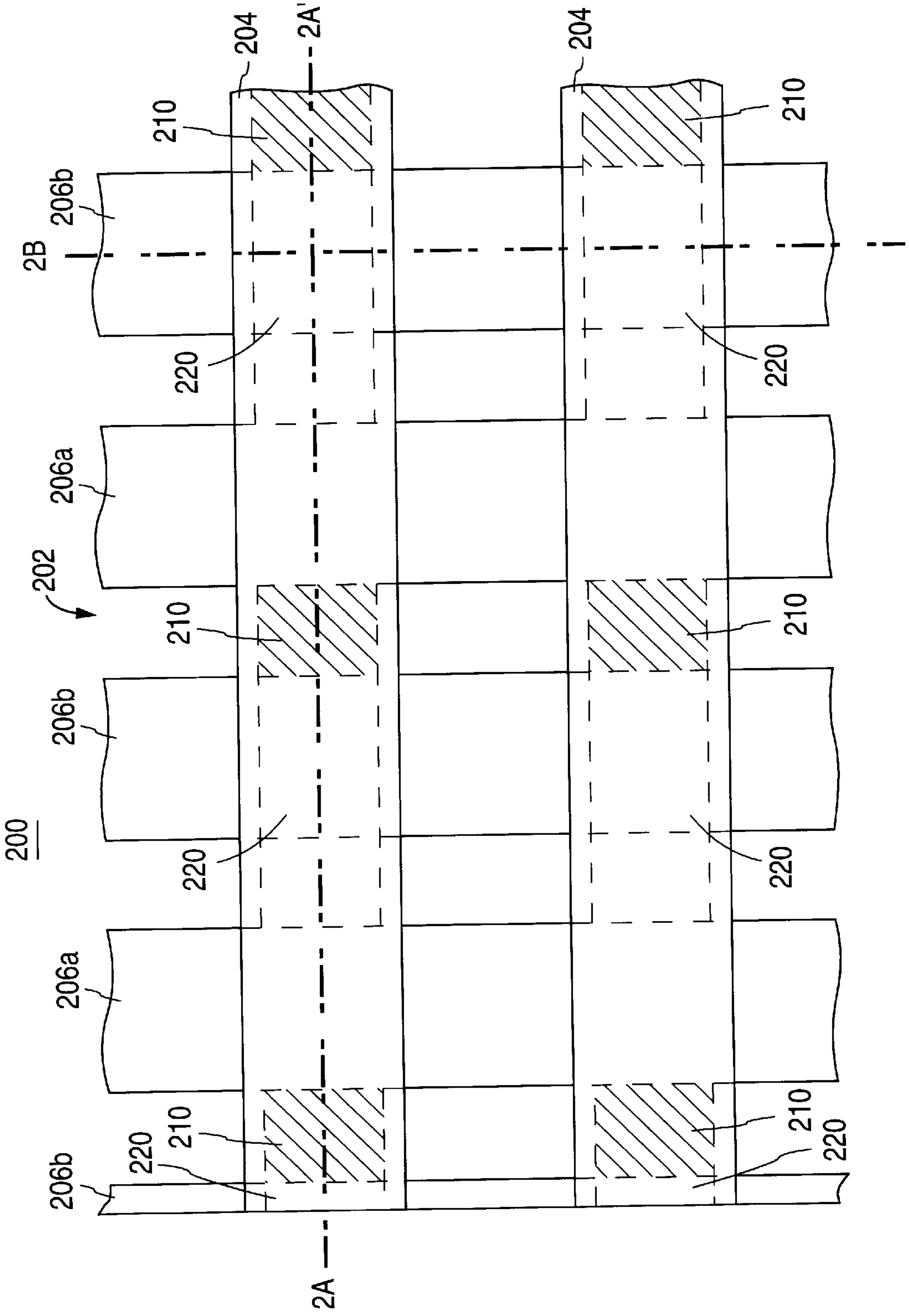
FIGS. 2–2B show plan and cross-sectional views of an alternate virtual ground ROM array in accordance with one embodiment of the present invention.
Figure 2A:
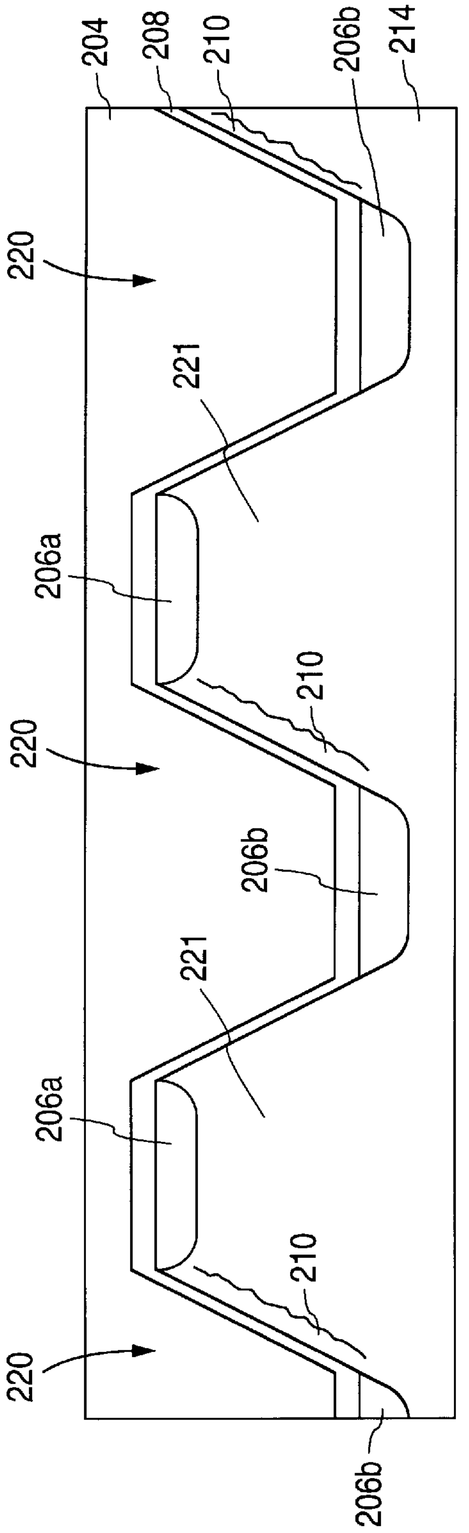
Figure 2B:
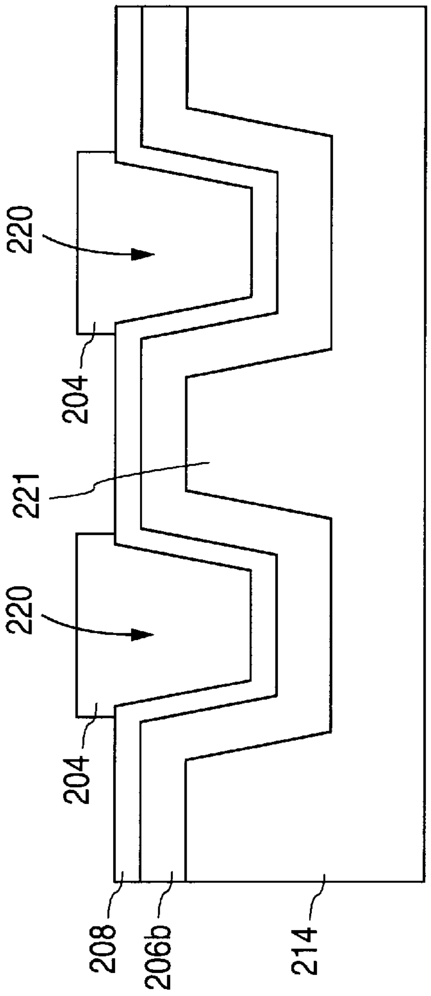

FIG. 2 shows a plan view of an NMOS ROM array structure in accordance with one embodiment of the present invention. FIG. 2A shows a cross-sectional view taken along line 2A–2A'. FIG. 2B shows a cross-sectional view taken along line 2B–2B'.

Figure 1:
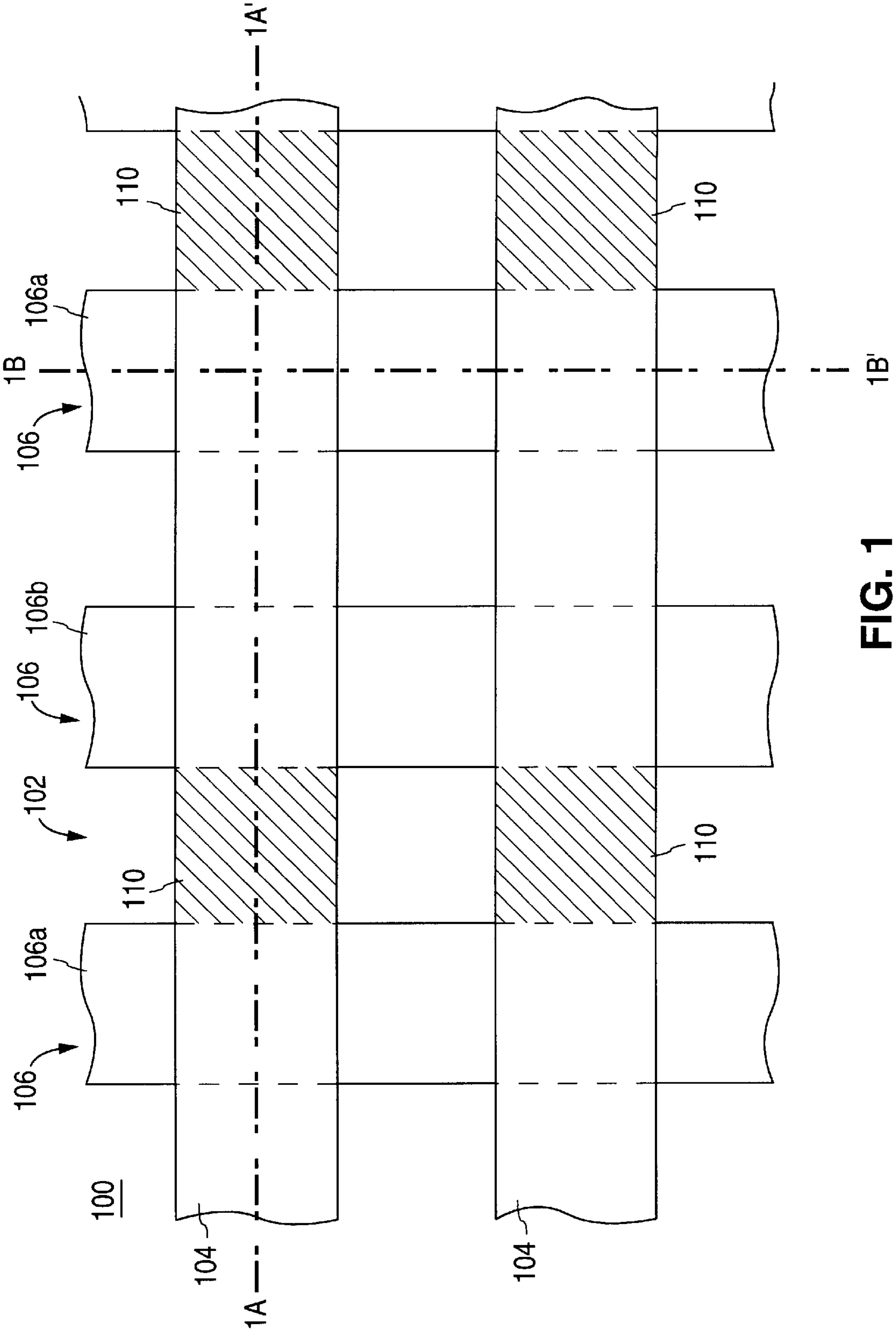
FIGS. 1–1B show plan and cross-sectional views of a conventional alternate virtual ground ROM array formed in a single horizontal plane, as proposed by U.S. Pat. No. 5,590,068.
Figure 1A:
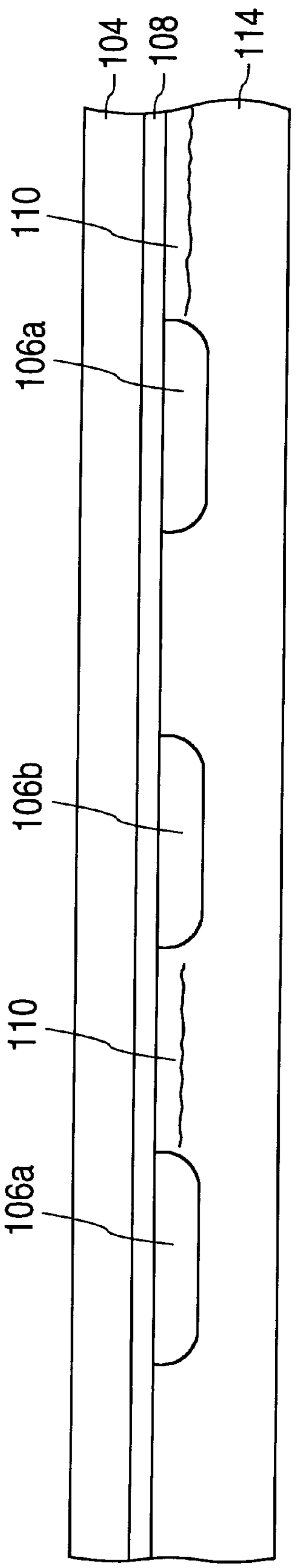
Figure 1B:
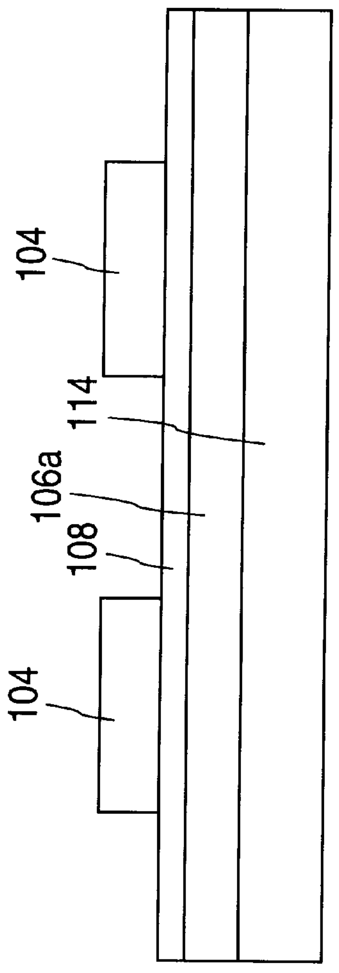

As with the ROM array structure shown in FIGS. 1–1B, cells 202 comprising ROM data storage array 200 are formed within lightly doped P-type silicon 214. Cells 200 are defined by the overlapping of a word line 204 with a pair of successive diffused bit lines 206. As disclosed in the '068 patent, diffused bit lines 206 actually consist of global diffused bit lines 206*a* alternating with local diffused bit lines 204*b*. Local diffused bit lines 206*b* are grounded and serve as the sources of cells 202 of array 200.

Polysilicon word lines 204 are oriented perpendicular to bit lines 206, and are separated from bit lines 206 by gate oxide layer 208. Where a polysilicon word line 204 crosses over channel region 210 between successive local diffused bit line 204*b* and a global diffused bit line 204*a*, a MOS semiconducting device 202 is created having local diffused bit line 206*b* as the source, global diffused bit line 206*a* as the drain, word line 204 as the gate, and gate oxide layer 208 as the gate oxide.

The primary difference between ROM data storage array 200 of FIGS. 2–2B and conventional array 100 of FIG. 1 is that successive bit lines 206*a*–*b* are disposed in vertically separated horizontal planes. Specifically, in array 200 of FIGS. 2–2B, local bit lines 206*b* are positioned within trenches 220 below global bit lines 204*a*, which are formed on top of mesas 221.

If the etching techniques employed to form trenches 220 result in the creation of substantially vertical sidewalls, diffused bit lines having little or no horizontal separation may be formed. This configuration would produce a MOS array having vertical channels between bit lines, and overall dimensions of $2\lambda^2$ for design rules based upon a word line/bit line pitch of $\lambda$. Thus, one-half the silicon surface area ordinarily consumed by existing array structures would be conserved.

Where near-vertical trench sidewalls are produced by etching, these features would offer a narrow target to an ion implant beam oriented perpendicular to the silicon surface. Therefore, titled ion implantation may advantageously be utilized to introduce dopant into channel regions. Titled implantation may also modify the channel dopant profile proximate to the source and drain regions and thereby compensate for the angular position of drain and source regions relative to the channel.

By disposing successive bit lines 204*a*–*b* on different horizontal planes, the present invention maintains the same channel length, and hence exhibits device characteristics closely approximating those of the conventional planar array structure. At the same time, the lateral dimensions of array 200 are substantially reduced.

FIGS. 3A–3GB show plan and cross-sectional views illustrating the process steps for forming the array structure in accordance with the embodiment shown in FIG. 2. As with prior FIGS. 1–1B and 2–2B, cross-sections are taken along lines 3XA–3XA' and 3XB–3XB'.

Figure 3A:
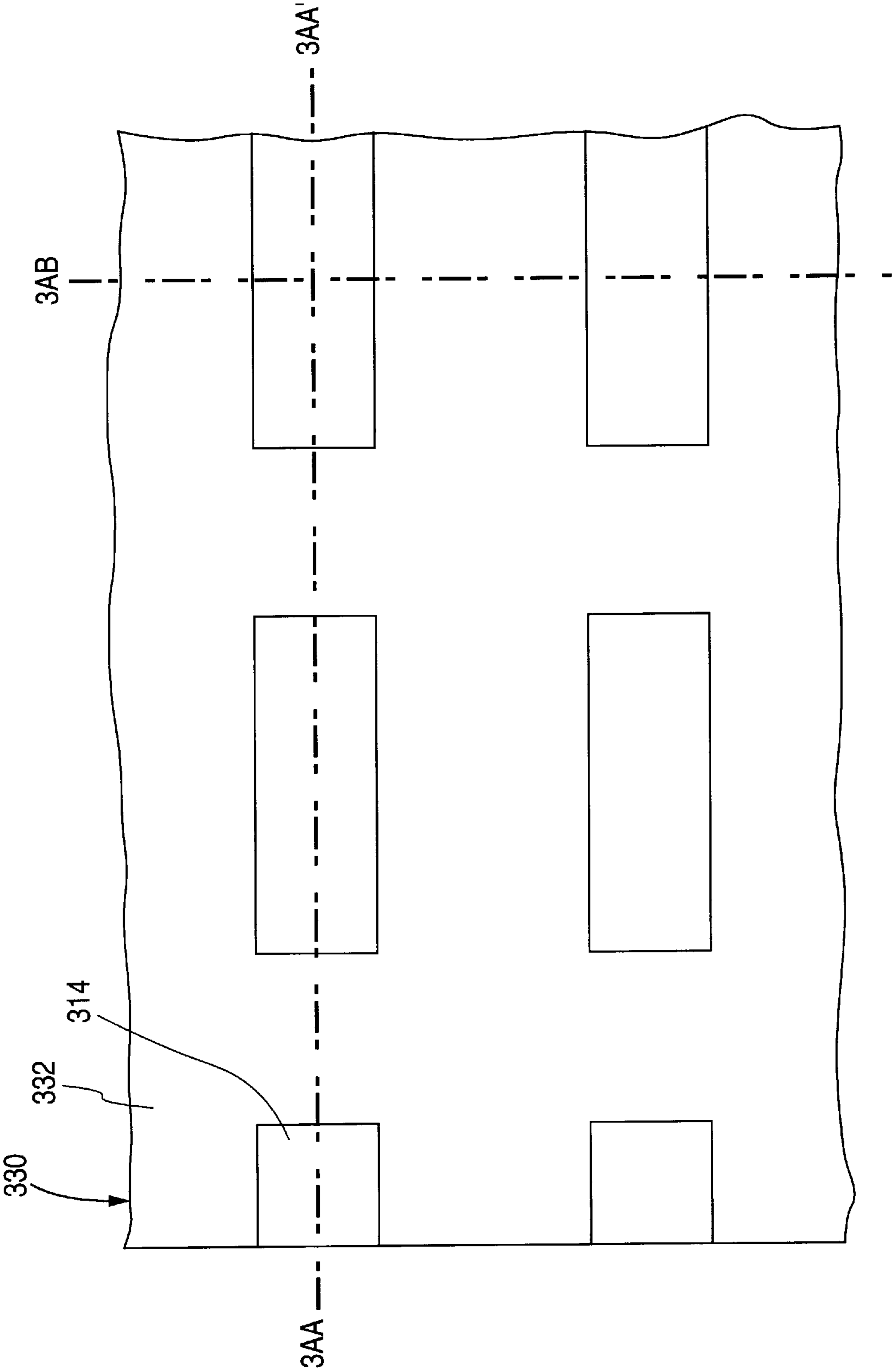
FIGS. 3–3GB show plan and cross-sectional views illustrating the steps for fabricating the ROM array shown in FIGS. 2–2B.
Figure 3A:
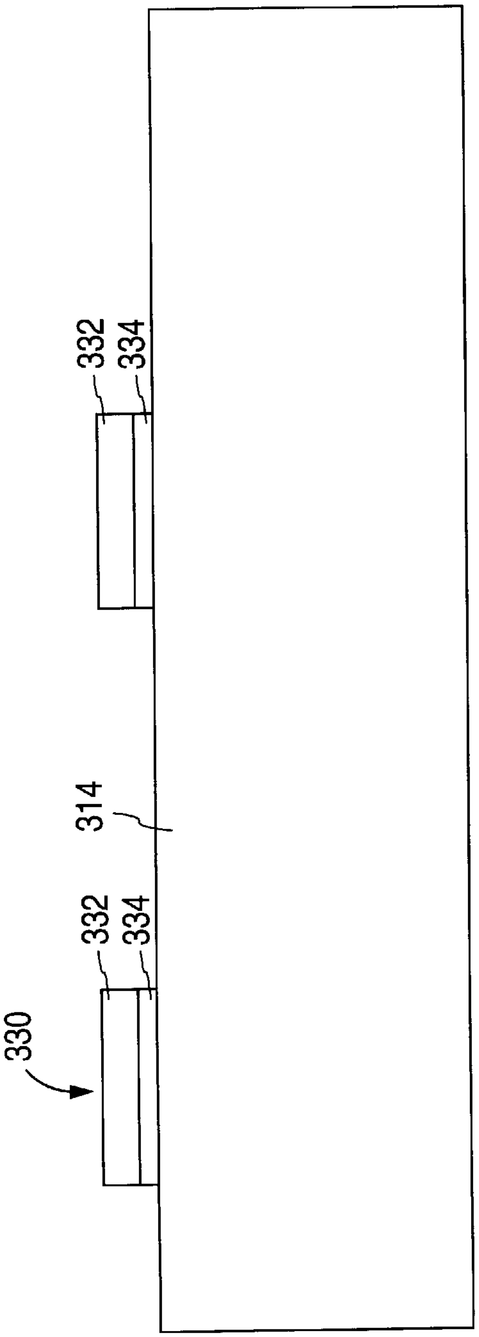
Figure 3A:
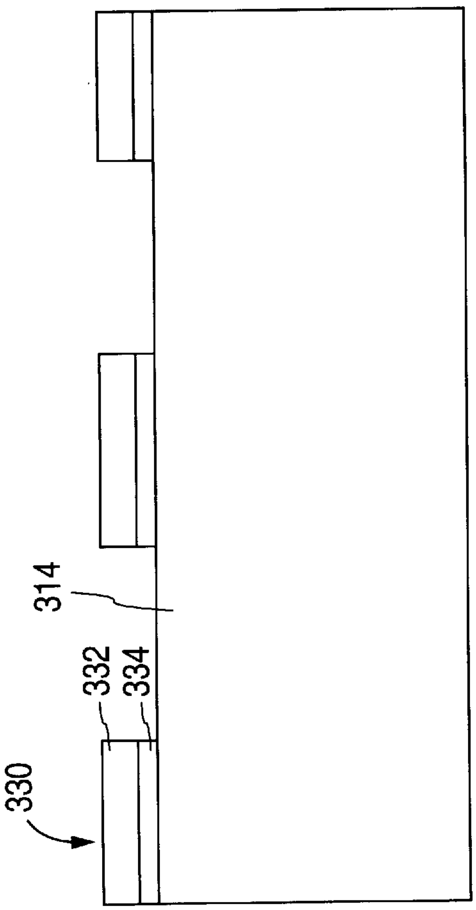

FIGS. 3A–3AB show the patterning of trench-formation mask 330 upon lightly doped P-type silicon 314. Trench-formation mask 330 consists of silicon nitride layer 332 formed over pad oxide 334. This same type of mask is conventionally used in forming shallow trench isolation structures, facilitating integration of the present invention with existing processes.

Figure 3B:
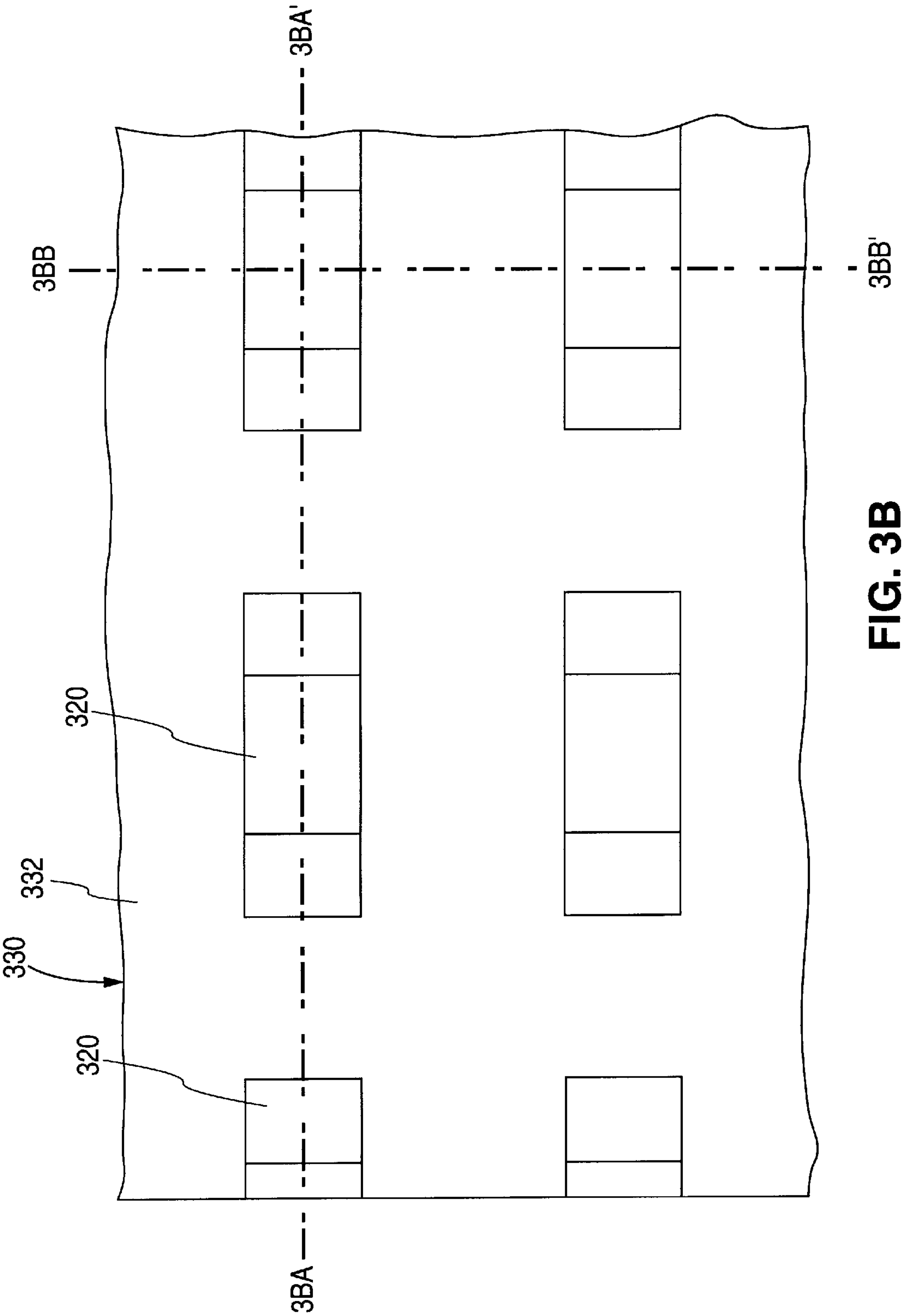
Figure 3B:
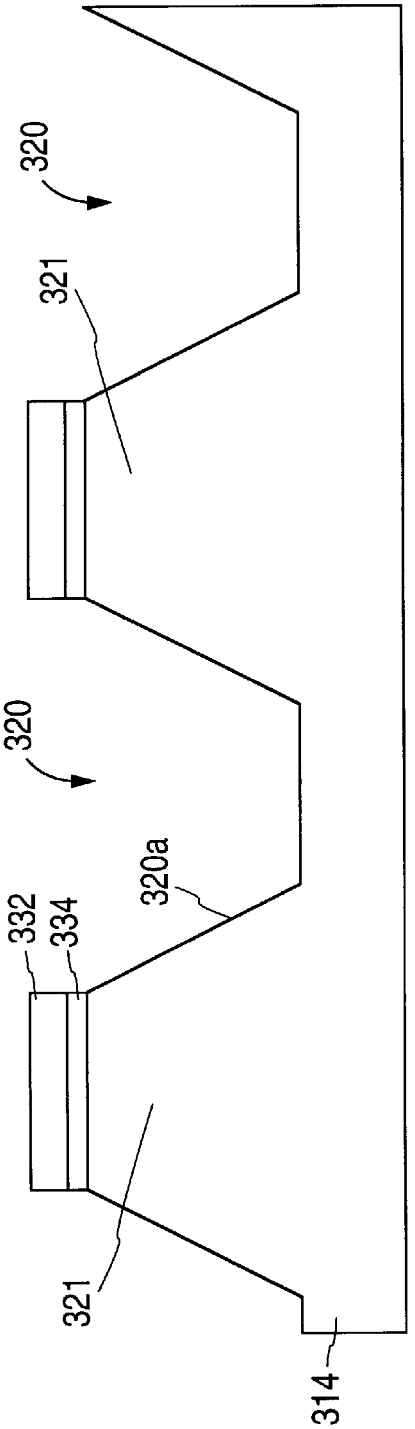
Figure 3B:
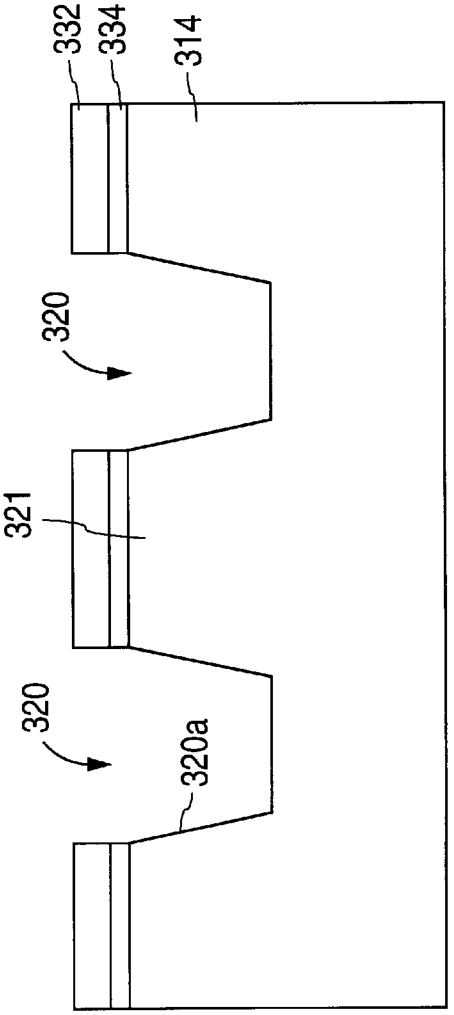

FIGS. 3B–3BB show etching of silicon selective to silicon nitride in unmasked regions, producing trenches 320 separated by mesas 321 in silicon 314. The etching chemistry employed will determine the angle of sidewalls 320*a* of trenches 320. Anisotropic etching conditions will produce trenches having almost vertical sidewalls.

Figure 3C:
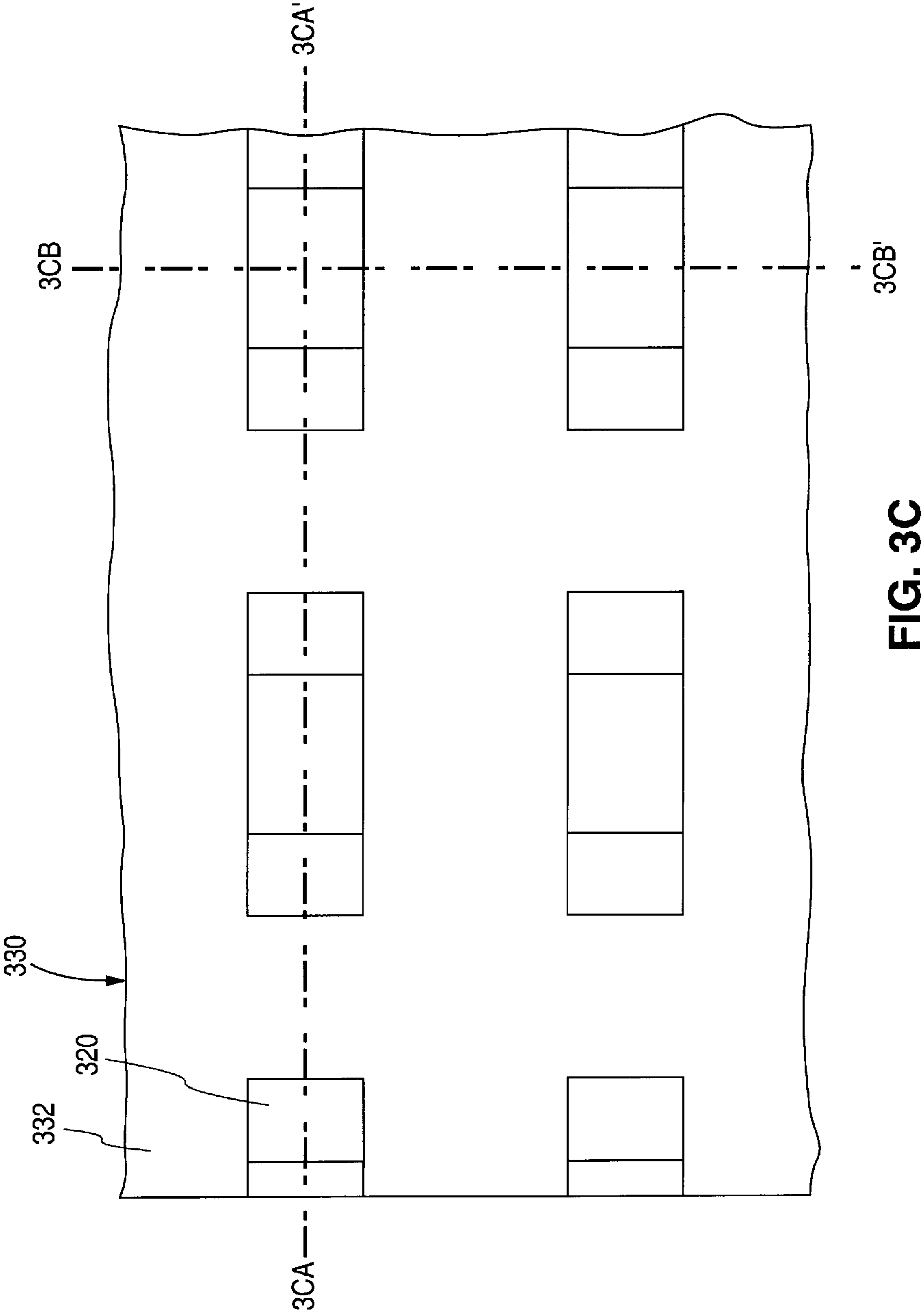
Figure 3C:
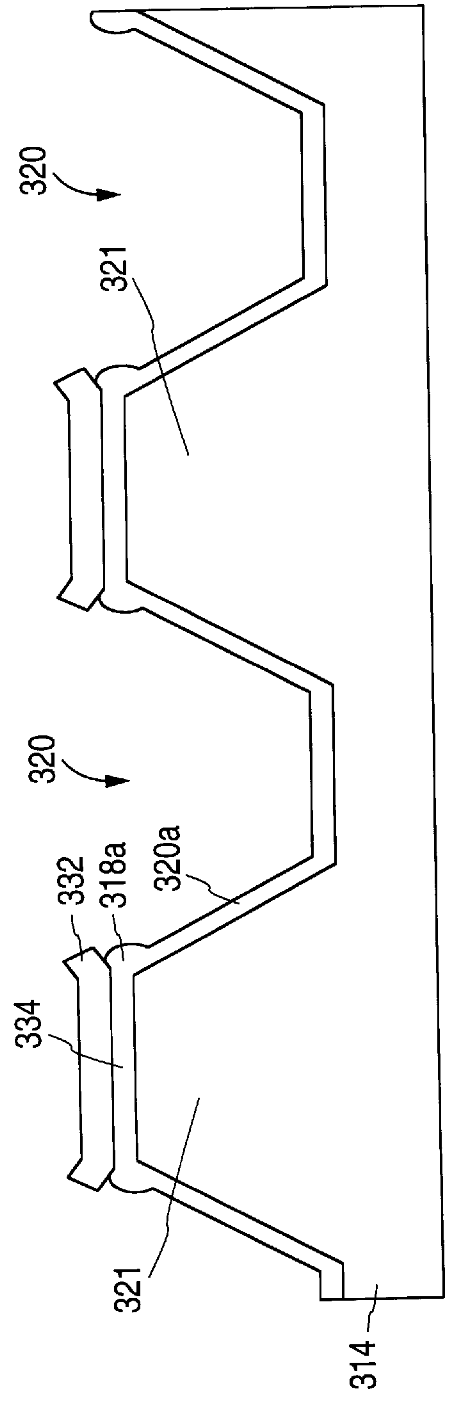
Figure 3C:
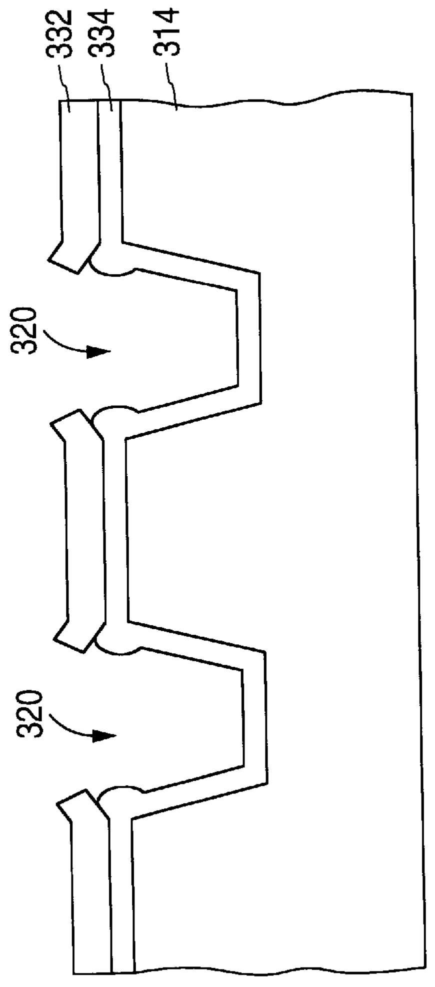

FIGS. 3C–3CB show oxidation of silicon 314, including silicon within trenches 320, to produce gate oxide layer 318. In FIG. 3C it is important to note that the "rounded-edge" oxide features 336 occurring at edges 318*a* of gate oxide layer 318 are due to exposure of unmasked mesa edges 340*a* to oxidizing conditions.

Figure 3D:
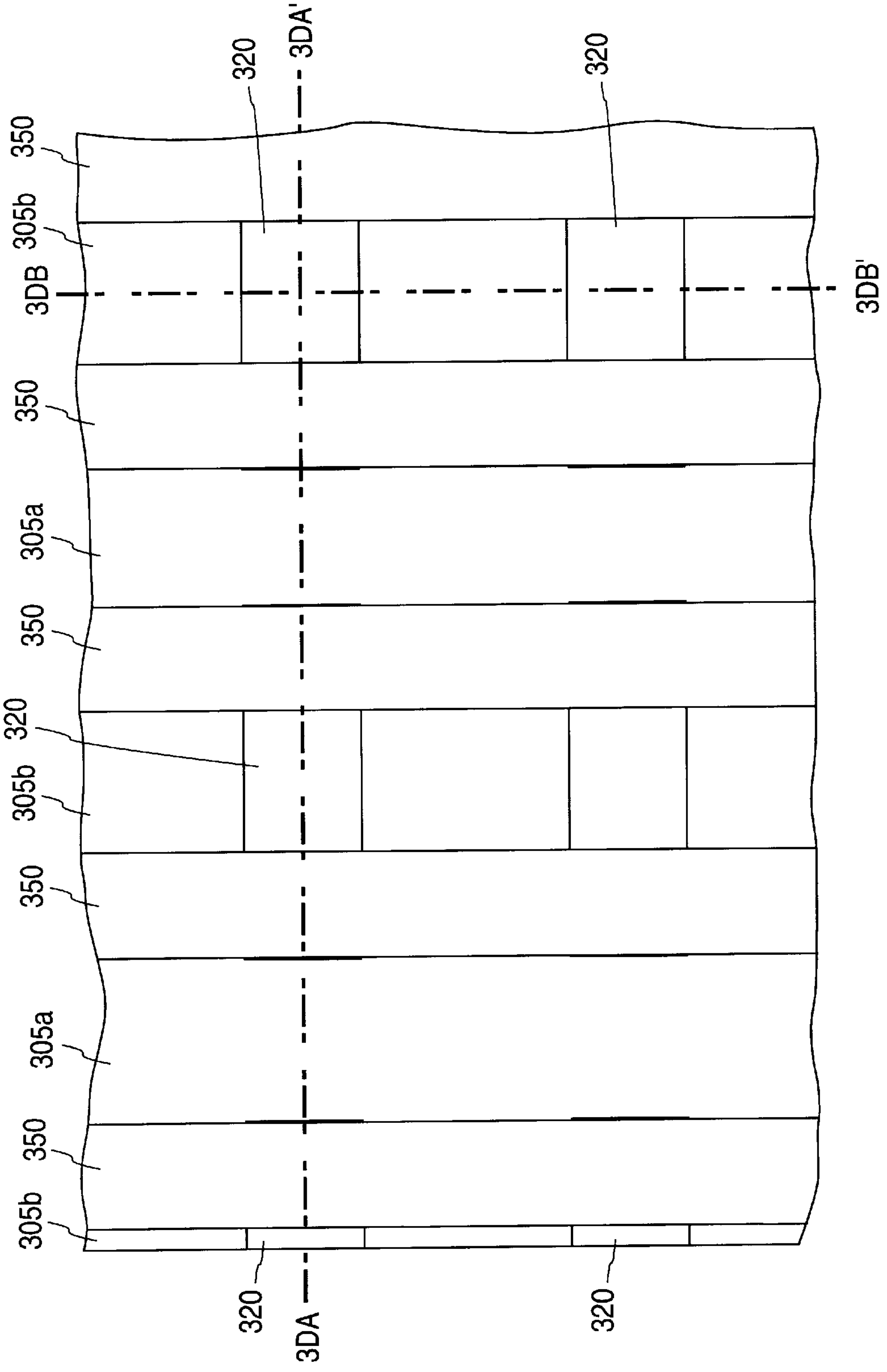
Figure 3D:
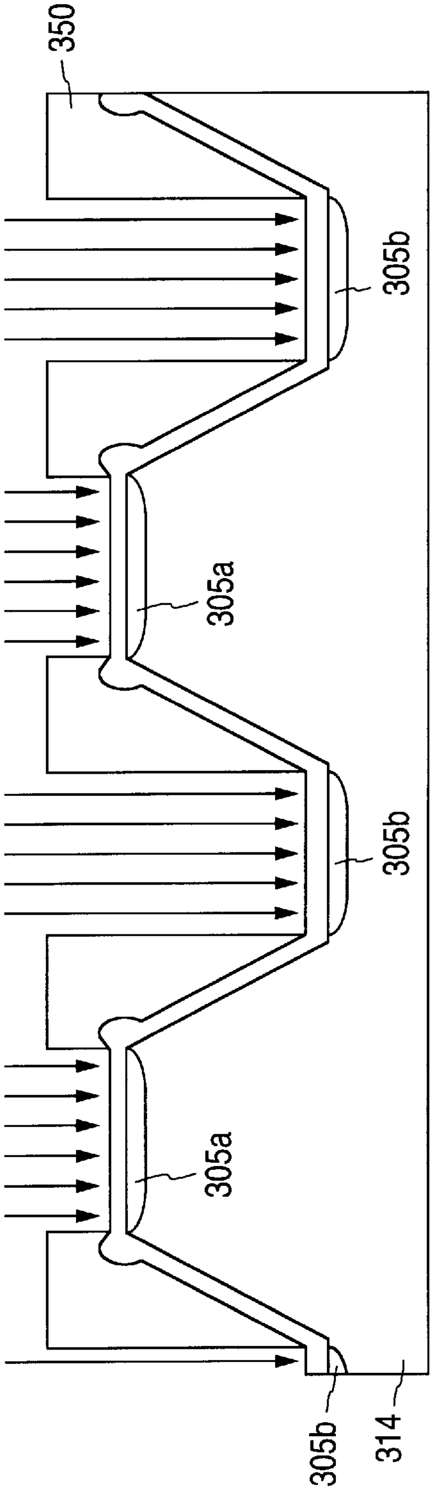
Figure 3D:
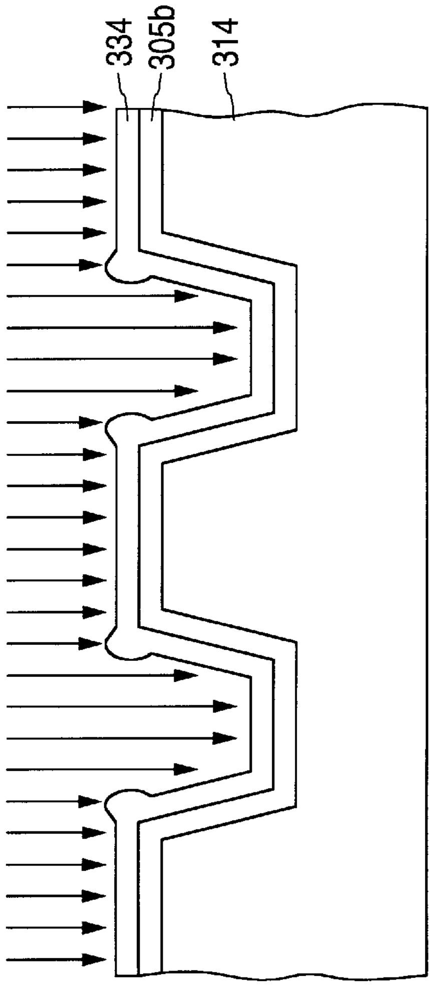

FIGS. 3D–DB show stripping of silicon nitride layer 332 of trench-formation mask 330, followed by patterning of bit line implant photoresist mask 350. vertically separated precursor bit line regions unmasked by bit line implant mask 350 are implanted with N type dopant to produce N+ implant regions 305*a* and 305*b* disposed in separate horizontal planes.

Figure 3E:
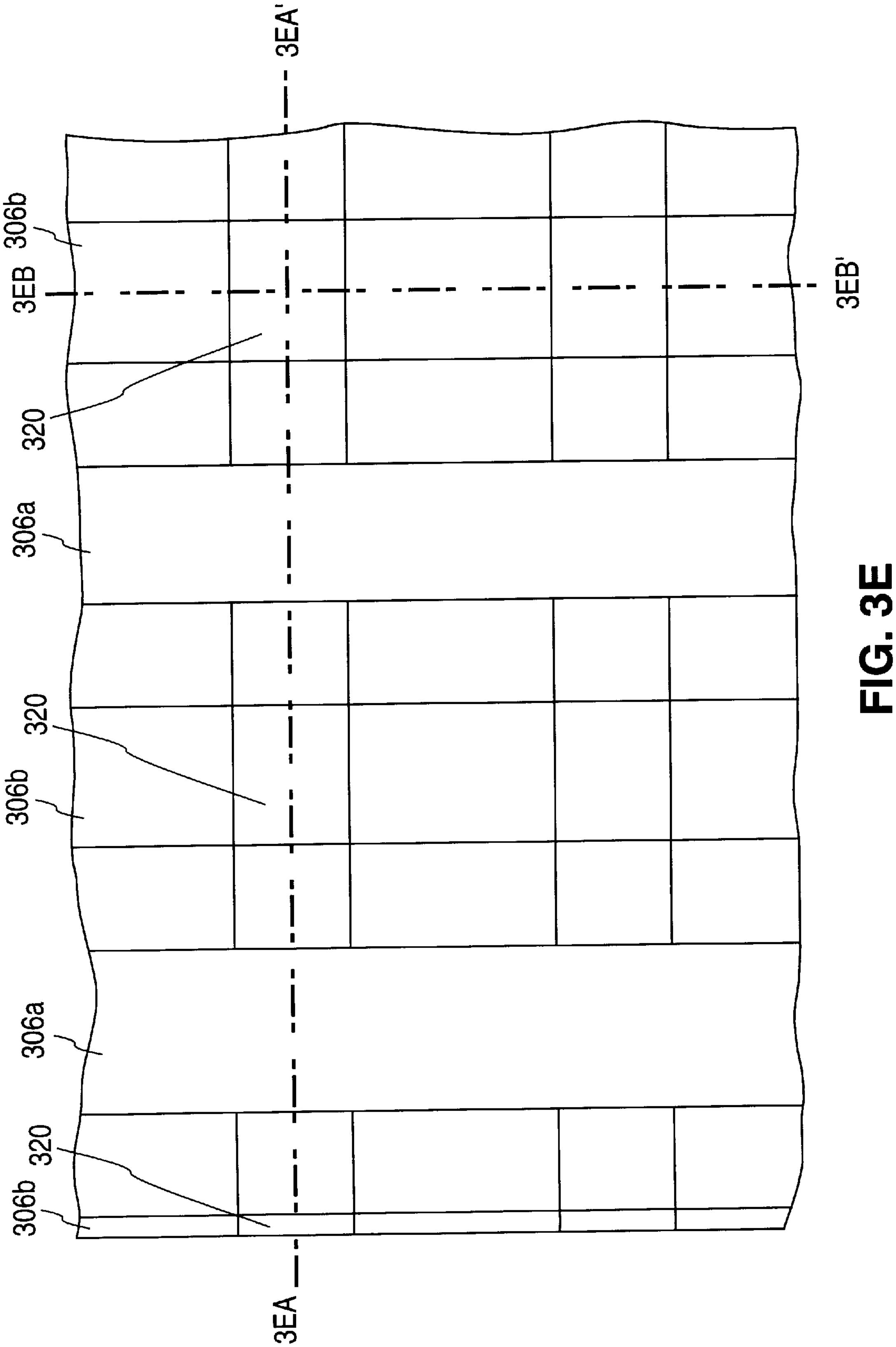
Figure 3E:
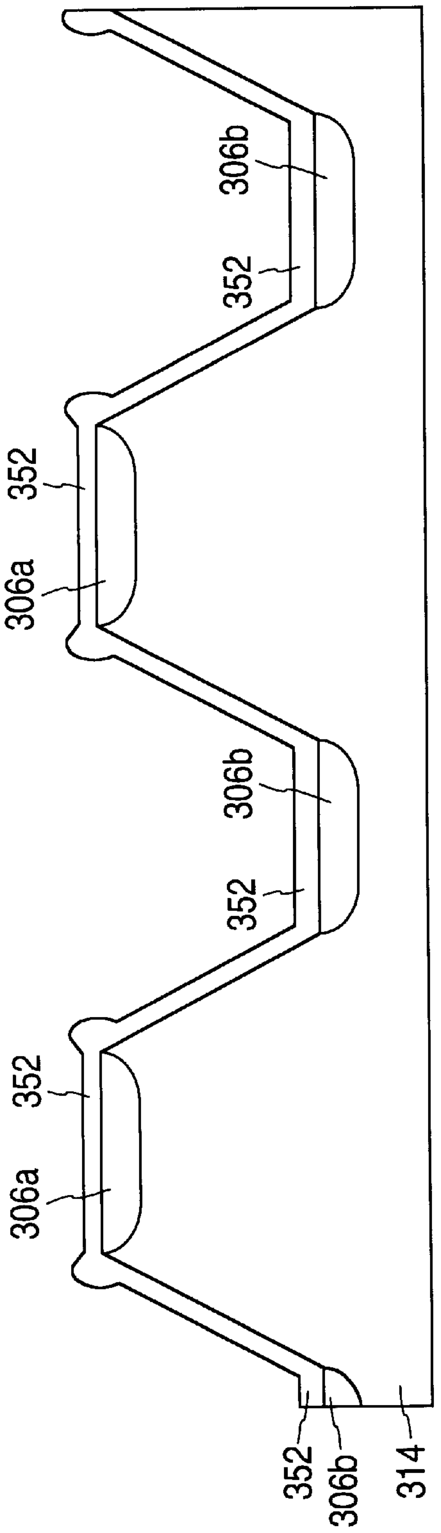
Figure 3E:
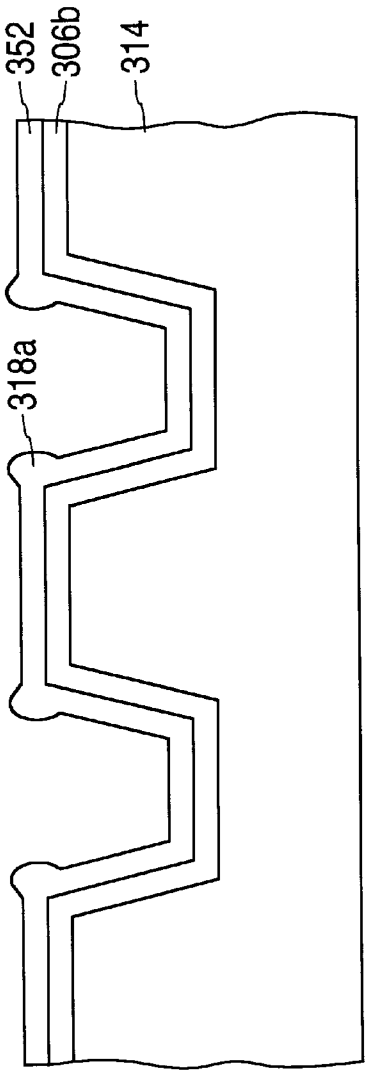

FIGS. 3E–3EB show removal of bit line implant photoresist mask 350, followed by thermal drive-in of implant regions 305*a* and 305*b* to form alternating, non-coplanar N+ diffused bit lines 306*a* and 306*b*. This thermal drive-in step is preferably carried out in oxidizing ambient to create thick oxide 352 over N+ diffused bit lines 306*a* and 306*b*.

Figure 3F:
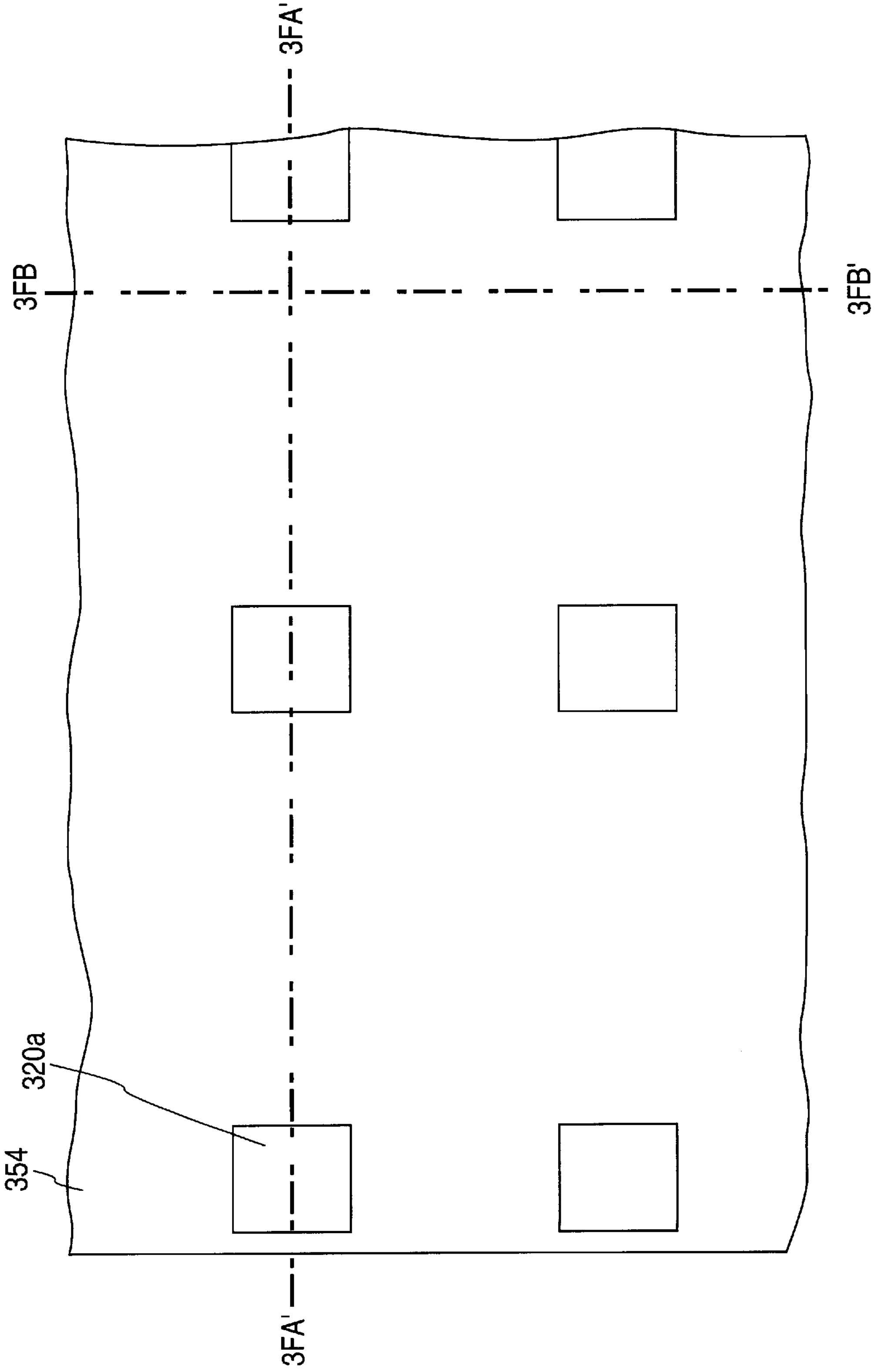
Figure 3F:
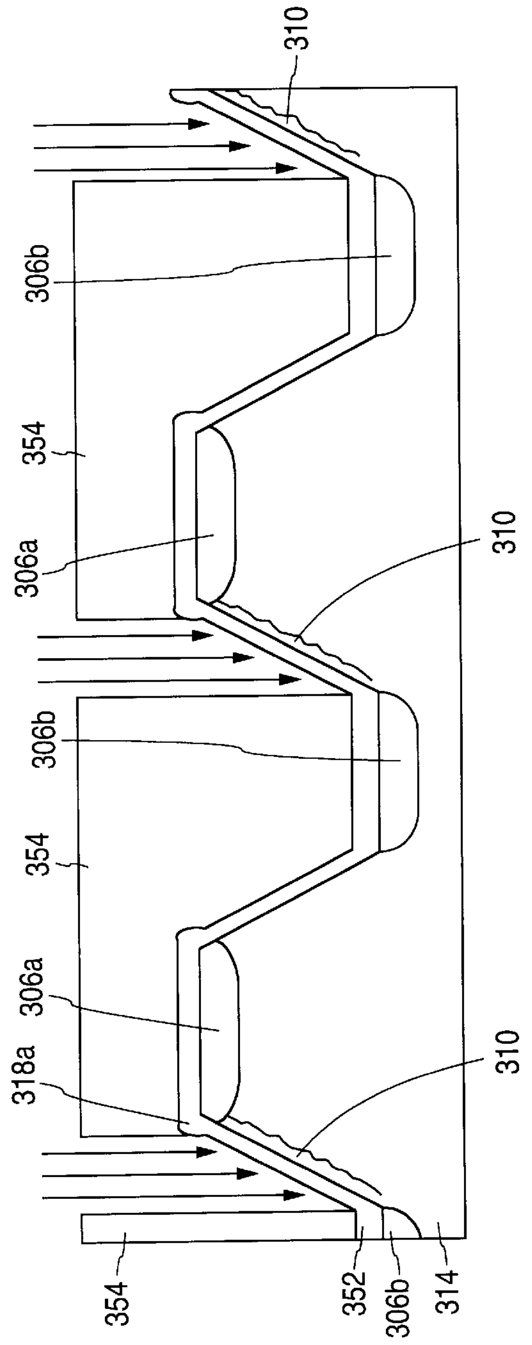
Figure 3F:
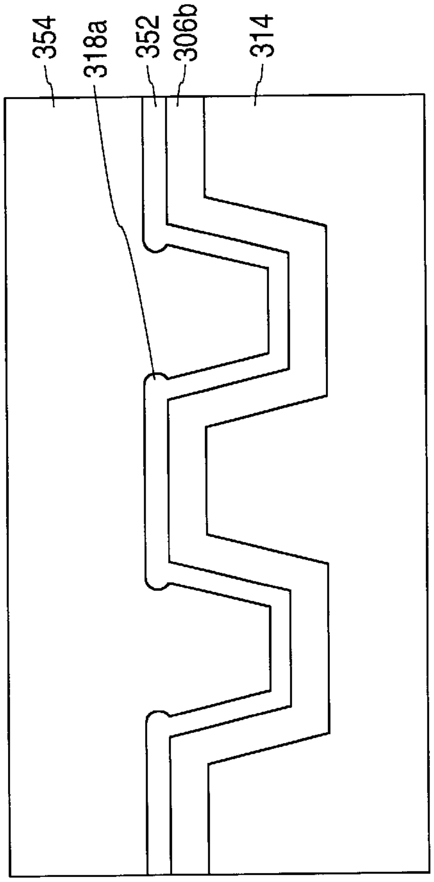

FIGS. 3F–3FB show patterning of ROM mask 354 over selected regions of the ROM array, followed by implantation of P type dopant into unmasked regions. This creates doped channels 310 only at selected locations.

Rounded edge oxidation features 336 would also mask implantation of P type dopant into the N+ diffused bit lines 306*a* and 306*b* during this step. Such masking would provide an extra margin for error as the ROM resist mask is being created.

As discussed above in connection with FIGS. 2–2B, etching of silicon 314 to create trenches 320 may produce near-vertical side walls. The trench side walls 320*a* created under such conditions would offer a narrow profile to an implanter poised normal to the silicon surface. Thus, while FIG. 3FA shows implantation normal to the silicon surface, the process in accordance with the present invention may also employ titled ion implantation at an angle of less than 90° to the silicon surface.

As is well known, tilted implantation may be accomplished by tilting and rotating the wafer platform during implantation. Titled implantation may also enable formation of channel regions having a dopant profile that compensates for the angular orientation of source and drain relative to the channel.

Figure 3G:
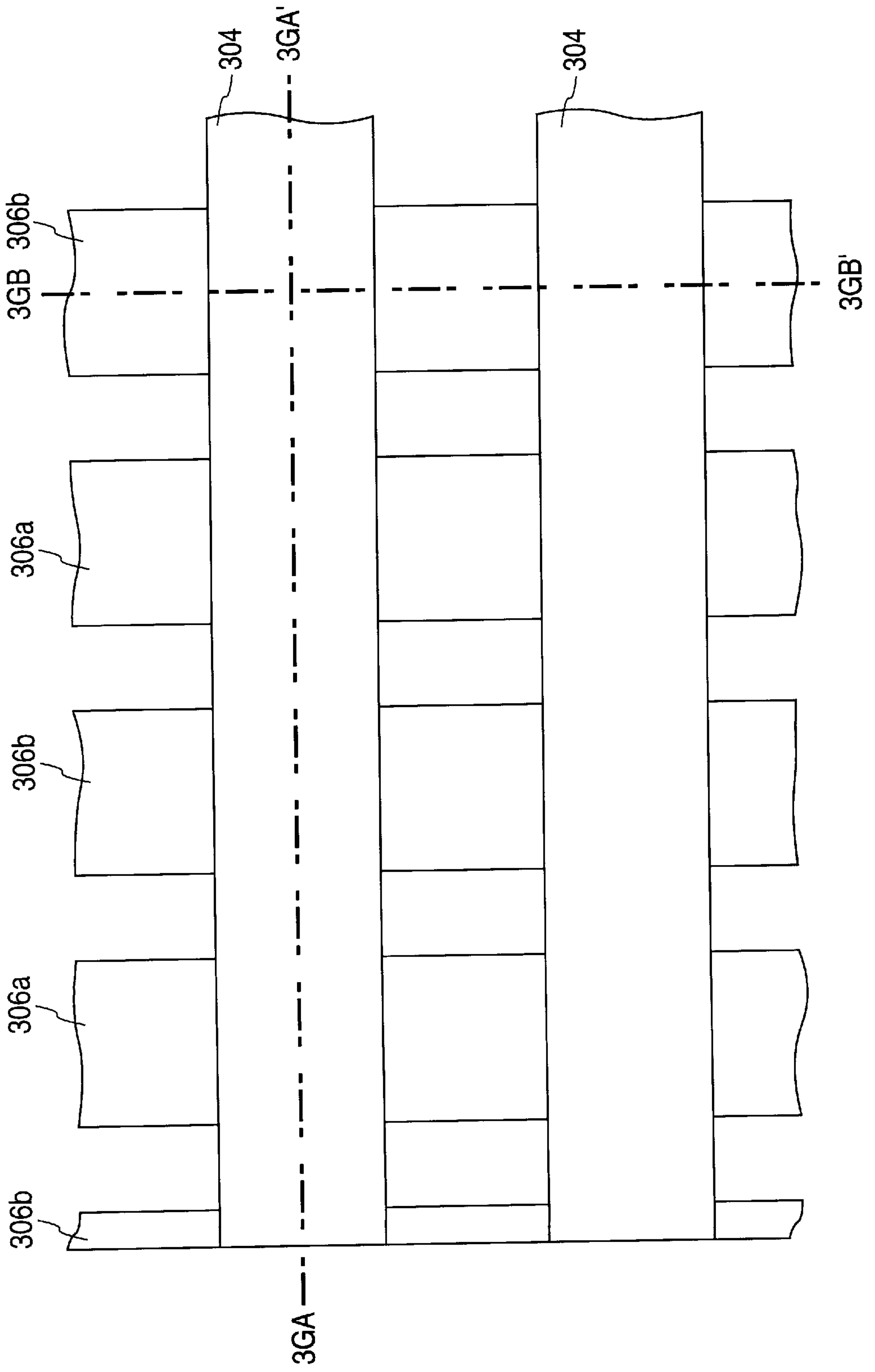
Figure 3G:
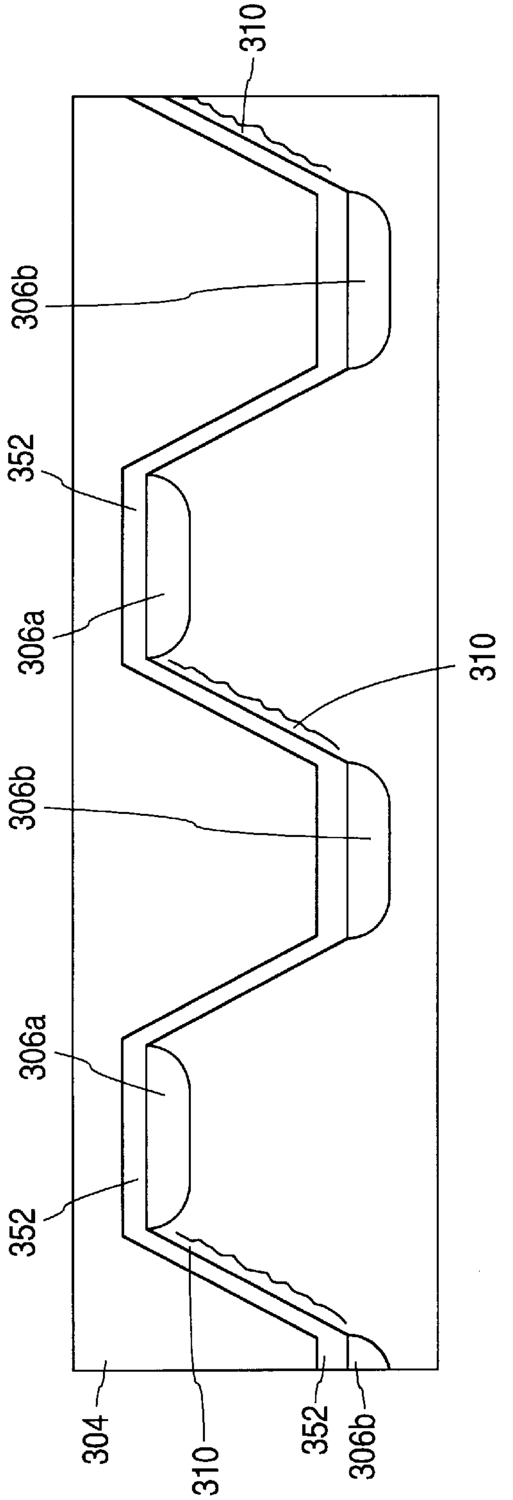
Figure 3G:
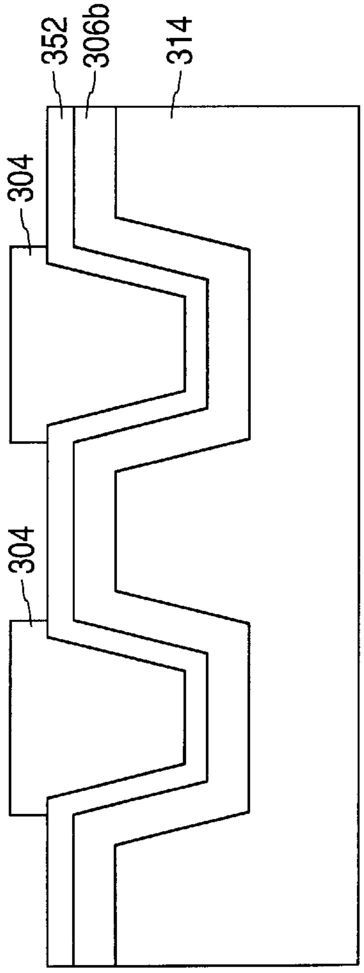

FIGS. 3G–3GB show completion of fabrication of the ROM array 300 in accordance with the present invention, with the formation of polysilicon word lines 304. Polysilicon word lines 304 are formed along an axis perpendicular to bit lines 306. Polysilicon word lines 304 are sufficiently broad to cover the entirety of trenches 320.

Although the invention has been described in connection with one specific embodiment, it should be understood that the invention as claimed should not be unduly limited to this specific embodiment. Various other modifications and alterations in the array structure and method of forming this structure will be apparent to those skilled in the art without departing from the scope of the present invention.

For example, while the present invention has been described above in connection with formation of an array of NMOS ROM devices, the present invention is equally applicable to the formation of an array made up of PMOS ROM devices.

Furthermore, while the present invention has been described above in connection with formation of an alternate virtual ground ROM array, the present invention is also applicable to formation of any MOS array structures that include channel regions defined by the overlapping of polysilicon word lines over semiconducting regions between bit lines.

Therefore, it is intended that the following claims define the scope of the present invention, and that the methods and structures within the scope of these claims and their equivalents be covered hereby.

What is claimed is:

1. A process for forming an array of ROM cells in a semiconductor workpiece comprising the steps of:

etching a semiconductor workpiece to form trenches having sidewalls, the trenches separated by mesas;

forming a bit line photoresist mask which excludes precursor bit line regions parallel to a first axis, said precursor bit line regions including first precursor bit line regions partially located within the trenches and second precursor bit line regions partially located on the mesas;

implanting dopant of a first conductivity type into the first and second precursor bit line regions to form first and second vertically separated bit lines;

removing the bit line photoresist mask;

applying thermal energy to the semiconductor workpiece such that an oxide layer is formed;

forming an array photoresist mask which excludes precursor channel regions positioned in the trench sidewalls;

implanting dopant of a second conductivity type opposite to the first conductivity type into the precursor channel regions; and forming a word line along a second axis perpendicular to the first axis.

2. The process according to claim 1 wherein the step of implanting dopant of the second conductivity type includes implanting dopant at an angle of less than 90° relative to the semiconductor workpiece.

3. The process according to claim 1 wherein the step of implanting dopant of the first conductivity type further comprises the steps of:

implanting dopant into first precursor bit line regions to form a global bit line of an alternate virtual ground ROM array; and implanting dopant into second precursor bit line regions to form a local bit line of the alternate virtual ground ROM array.

4. The process according to claim 1 wherein the step of implanting dopant of the first conductivity type further comprises the steps of:

implanting dopant into first precursor bit line regions to form a local bit line of an alternate ground ROM array; and implanting dopant into second precursor bit line regions to form a global bit line of the alternate virtual ground ROM array.

5. The process according to claim 1 wherein the step of implanting dopant of the first conductivity type includes implanting N type dopant.

6. The process according to claim 1 wherein the step of implanting dopant of the first conductivity type includes the step of implanting P type dopant.

* * * * *